United States Patent
Kubena et al.

(10) Patent No.: US 10,921,360 B2
(45) Date of Patent: Feb. 16, 2021

(54) DUAL MAGNETIC AND ELECTRIC FIELD QUARTZ SENSOR

(71) Applicant: HRL Laboratories, LLC, Malibu, CA (US)

(72) Inventors: Randall L. Kubena, Oak Park, CA (US); Walter S. Wall, Calabasas, CA (US); Yook-Kong Yong, Princeton, NJ (US); Richard J. Joyce, Thousand Oaks, CA (US)

(73) Assignees: HRL Laboratories, LLC, Malibu, CA (US); Rutgers University, Piscataway, NJ (US)

( * ) Notice: Subject to any disclaimer, the term of this patent is extended or adjusted under 35 U.S.C. 154(b) by 0 days.

(21) Appl. No.: 16/269,847

(22) Filed: Feb. 7, 2019

(65) Prior Publication Data

US 2019/0250198 A1 Aug. 15, 2019

Related U.S. Application Data

(60) Provisional application No. 62/628,612, filed on Feb. 9, 2018.

(51) Int. Cl.
*G01R 29/08* (2006.01)
*H04B 17/318* (2015.01)
*H04B 17/21* (2015.01)

(52) U.S. Cl.
CPC ......... *G01R 29/0878* (2013.01); *H04B 17/21* (2015.01); *H04B 17/318* (2015.01)

(58) Field of Classification Search
None
See application file for complete search history.

(56) References Cited

U.S. PATENT DOCUMENTS

| | | | | |
|---|---|---|---|---|
| 3,821,638 A | * | 6/1974 | Kobayashi et al. | G01R 33/07 324/251 |
| 4,314,204 A | * | 2/1982 | Biehl | H01P 7/06 324/316 |
| 4,672,305 A | * | 6/1987 | Coleman | G01W 1/16 324/72 |
| 5,659,270 A | * | 8/1997 | Millen | H03L 1/028 310/315 |

(Continued)

FOREIGN PATENT DOCUMENTS

| | | | |
|---|---|---|---|
| EP | 0496583 A2 * | 7/1992 | H03H 9/02023 |
| EP | 0496583 A2 | 7/1992 | |

(Continued)

OTHER PUBLICATIONS

Azad, U., et al., "Direct Antenna Modulation (DAM) for Enhanced Capacity Performance of Near-Field Communication (NFC) Link," IEEE Transactions on Circuits and Systems—I: Regular Papers vol. 61, No. 3, pp. 902-910, Mar. 2014. (Year: 2014).*

(Continued)

*Primary Examiner* — Berhanu Tadese
(74) *Attorney, Agent, or Firm* — Ladas & Parry

(57) ABSTRACT

A RF field sensor in which a magnetostrictive film is deposited on one or more electrodes of one or more quartz resonator(s) in which an electric field of the RF field is detected along one axis of the RF field sensor and a magnetic field of the RF field is detected along an orthogonal axis of the RF field sensor simultaneously.

20 Claims, 6 Drawing Sheets

(56) References Cited

U.S. PATENT DOCUMENTS

| | | | | |
|---|---|---|---|---|
| 5,675,252 | A * | 10/1997 | Podney | G01R 33/02 324/209 |
| 5,962,786 | A * | 10/1999 | Le Traon | G01P 15/097 310/323.01 |
| 6,194,900 | B1 * | 2/2001 | Freeman | G01R 33/302 324/318 |
| 6,483,480 | B1 * | 11/2002 | Sievenpiper | H01Q 3/44 343/700 MS |
| 6,812,903 | B1 * | 11/2004 | Sievenpiper | H01Q 3/12 343/753 |
| 6,888,424 | B2 | 5/2005 | Takeuchi | |
| 7,575,807 | B1 * | 8/2009 | Barvosa-Carter | F03G 7/065 428/411.1 |
| 7,716,985 | B2 * | 5/2010 | Zhang | G01P 15/0907 73/514.34 |
| 7,750,535 | B2 | 7/2010 | Kubena | |
| 7,774,155 | B2 * | 8/2010 | Sato | A63F 13/06 702/127 |
| 7,851,971 | B2 | 12/2010 | Chang | |
| 7,892,630 | B1 * | 2/2011 | McKnight | B32B 33/00 428/212 |
| 7,892,876 | B2 * | 2/2011 | Mehregany | G01P 15/125 438/51 |
| 8,390,387 | B2 | 3/2013 | Lander | |
| 8,618,894 | B2 * | 12/2013 | Kim | H01P 1/201 333/202 |
| 8,760,157 | B2 | 6/2014 | Miller | |
| 8,765,615 | B1 | 7/2014 | Chang | |
| 8,803,751 | B1 * | 8/2014 | Miller | H01Q 7/06 343/787 |
| 8,912,711 | B1 * | 12/2014 | Chang | H03H 9/19 310/367 |
| 9,211,690 | B1 | 12/2015 | McKnight | B32B 3/14 |
| 9,250,074 | B1 * | 2/2016 | Kubena | G01C 19/5684 |
| 9,250,452 | B1 * | 2/2016 | Yap | G02B 6/4279 |
| 9,383,208 | B2 * | 7/2016 | Mohanty | H03B 5/30 |
| 9,825,610 | B1 * | 11/2017 | Churchill | H03H 9/46 |
| 9,879,997 | B1 * | 1/2018 | Kubena | G01C 19/5684 |
| 9,977,097 | B1 * | 5/2018 | Nguyen | G01R 33/0286 |
| 9,991,863 | B1 * | 6/2018 | Kubena | H03H 9/19 |
| 10,031,191 | B1 * | 7/2018 | Nguyen | G01R 33/0283 |
| 10,110,198 | B1 * | 10/2018 | Kubena | H03H 9/125 |
| 10,126,376 | B1 * | 11/2018 | Nguyen | G01R 33/0283 |
| 10,175,307 | B1 * | 1/2019 | Sorenson | G01R 33/0286 |
| 10,177,737 | B1 * | 1/2019 | Kubena | H01L 41/047 |
| 10,266,398 | B1 * | 4/2019 | Kubena | B81B 3/0078 |
| 10,308,505 | B1 * | 6/2019 | Kirby | B81B 3/00 |
| 10,389,392 | B1 * | 8/2019 | Kubena | H04B 1/0458 |
| 2002/0166379 | A1 * | 11/2002 | Paros | G01C 19/5607 73/504.12 |
| 2004/0194548 | A1 * | 10/2004 | Dayagi | C07D 339/04 73/580 |
| 2004/0263408 | A1 * | 12/2004 | Sievenpiper | H01Q 3/46 343/757 |
| 2005/0082944 | A1 * | 4/2005 | Thompson | G01N 33/54373 310/318 |
| 2005/0122115 | A1 * | 6/2005 | Maguire | G01R 33/345 324/322 |
| 2005/0174014 | A1 * | 8/2005 | Korden | H03H 9/25 310/322 |
| 2006/0160136 | A1 * | 7/2006 | Xiang | G01N 24/088 435/7.1 |
| 2007/0001773 | A1 * | 1/2007 | Oxborrow | H01P 7/10 331/154 |
| 2007/0017287 | A1 * | 1/2007 | Kubena | G01C 19/5684 73/504.02 |
| 2007/0082642 | A1 * | 4/2007 | Hattori | H03H 9/542 455/286 |
| 2007/0180911 | A1 * | 8/2007 | Shoji | G01P 15/105 73/514.31 |
| 2007/0205849 | A1 * | 9/2007 | Otis | H03H 9/545 333/187 |
| 2007/0216406 | A1 * | 9/2007 | Witcraft | G01R 33/09 324/252 |
| 2008/0136418 | A1 * | 6/2008 | Renz | G01R 33/365 324/322 |
| 2008/0163689 | A1 * | 7/2008 | Thompson | G01N 29/036 73/590 |
| 2009/0003136 | A1 * | 1/2009 | Karr | A63B 24/0021 367/128 |
| 2009/0109048 | A1 * | 4/2009 | Spivak | H03K 17/94 340/686.6 |
| 2009/0147254 | A1 * | 6/2009 | Kirby | G01N 21/658 356/301 |
| 2010/0176809 | A1 * | 7/2010 | Biber | G01R 33/3692 324/309 |
| 2011/0062955 | A1 * | 3/2011 | Miller | H01Q 17/00 324/249 |
| 2013/0201316 | A1 * | 8/2013 | Binder | H04L 67/12 348/77 |
| 2013/0217979 | A1 * | 8/2013 | Blackadar | A61B 5/7264 600/301 |
| 2014/0111019 | A1 * | 4/2014 | Roy | H02J 50/60 307/104 |
| 2014/0113828 | A1 * | 4/2014 | Gilbert | H01L 39/225 505/100 |
| 2015/0295320 | A1 * | 10/2015 | Lee | G01R 33/34038 324/322 |
| 2015/0323694 | A1 * | 11/2015 | Roy | B60L 53/124 307/104 |
| 2016/0003924 | A1 * | 1/2016 | Sun | G01R 33/28 324/322 |
| 2016/0118954 | A1 | 4/2016 | Clark | |
| 2016/0209478 | A1 * | 7/2016 | Forstner | G01R 33/05 |
| 2016/0327597 | A1 * | 11/2016 | Ghionea | G01R 29/12 |
| 2016/0380357 | A1 * | 12/2016 | Keller | H01Q 9/04 343/731 |
| 2016/0380487 | A1 * | 12/2016 | Widmer | H02J 50/12 324/654 |
| 2016/0380488 | A1 * | 12/2016 | Widmer | B60L 53/36 324/207.15 |
| 2017/0141622 | A1 * | 5/2017 | Meichle | B60L 53/38 |
| 2017/0212060 | A1 * | 7/2017 | Hao | G01N 22/00 |
| 2017/0244377 | A1 * | 8/2017 | Yamane | H01L 43/08 |
| 2017/0276848 | A1 * | 9/2017 | Sinclair | G02B 5/201 |
| 2017/0345449 | A1 * | 11/2017 | Shibata | G01R 33/1284 |
| 2017/0359025 | A1 | 12/2017 | Kishi | |
| 2018/0040666 | A1 * | 2/2018 | Shibata | H01L 43/08 |
| 2018/0057409 | A1 * | 3/2018 | Rosseinsky | C04B 35/6264 |
| 2018/0083595 | A1 * | 3/2018 | Kaida | H03H 9/132 |
| 2018/0115070 | A1 * | 4/2018 | Wang | H01Q 7/06 |
| 2018/0198211 | A1 * | 7/2018 | Wall | H01Q 9/16 |
| 2018/0226720 | A1 * | 8/2018 | Wall | H03H 7/38 |
| 2018/0248516 | A1 * | 8/2018 | Noto | H03H 9/0552 |
| 2018/0275230 | A1 * | 9/2018 | Trakimas | G01R 33/302 |
| 2018/0302032 | A1 * | 10/2018 | Oya | H03H 9/02133 |
| 2018/0323768 | A1 * | 11/2018 | Ikeda | H03H 9/13 |
| 2019/0072374 | A1 * | 3/2019 | Mann | G01B 7/24 |
| 2019/0123714 | A1 * | 4/2019 | Kizu | H03H 9/0595 |
| 2019/0245254 | A1 * | 8/2019 | Yamane | H01L 43/08 |
| 2019/0250198 | A1 * | 8/2019 | Kubena | G01R 29/0878 |

FOREIGN PATENT DOCUMENTS

| | | | | |
|---|---|---|---|---|
| WO | WO-2009045576 A2 * | 4/2009 | | G01N 21/658 |
| WO | WO-2015072985 A1 * | 5/2015 | | G01R 33/3678 |

OTHER PUBLICATIONS

Bennett, S.P., et al., "Magnetic Field Response of Doubly Clamped Magneto-Electric Microelectromechanical AlN-FeCo Resonators," Applied Physics Letters 111, 2017, 5 pages (Year: 2017).*

Filter Inductors—1812FS Series Datasheet, Oct. 12, 2015, retrieved online at: www.coilcraft.com/pdfs/l812fs.pdf (Year: 2015).*

Gamble, J.T., "Wideband Coherent Communication at VLF with the Experimental Transmitting Antenna Modulator (ETAM)," No. RADC-TR-73-287, Rome Air Development Center, Air Force Systems Command, Griffiss Air Force Base, NY, Dec. 1973. (Year: 1973).*

(56) References Cited

OTHER PUBLICATIONS

Hansen, R.C. et al., "Small Antenna Handbook," John Wiley & Sons, Inc., 2011, Chapter3 (Year: 2011).*
Hu, Z. et al., "Voltage Control of Magnetism in FeGaB/PIN-PMN-PT Multif erroic Heterostructure for High-Power and High-Temperature Applications," Applied Physics Letters, 106, Feb. 29, 2001 (2015), 4 pages (Year: 2015).*
Kawashima, H., "New Cuts for Width-Extensional Mode Quartz Crystal Resonators," Electronics & Communications in Japan, Part 3, vol. 76, No. 12, pp. 28-36, Apr. 1993. (Year: 1993).*
Kim, H.J. et. al., "Piezoelectric/Magnetostructure MEMS Resonant Sensor Array for in-Plane Multi-Axis Magnetic Field Detection," IEEE MEMS 2017. (Year: 2017).*
Kirby, et al. "Miniaturized VHF Quartz MEMs Resonator Design Methodology," 2017 Frequency Control Symposium, Jul. 10-13, 2017, Besancon, France. (Year: 2017).*
Klemmer, T.J. et al., "Ultrahigh Frequency Permeability of Sputtered Fe—Co—B Thin Films," Journal of Applied Physics, vol. 87, No. 2, Jan. 15, 2000 (Year: 2000).*
Kubena, R. "UHF Quartz MEMS Oscillators for Dynamics-Based System Enhancements," 2013 IEEE International Frequency Control Symposium, Prague, Czech Republic, Jul. 22-26, 2013 (8 pages) (Year: 2013).*
Kubena, R., et al., "A Fully Integrated Quartz MEMS VHF TCXO," 2017 (Year: 2017).*
Kubena, R., et al., "MEMS-based UHF Monolithic Crystal Filters for Integrated RF Circuits," Journal ofMicroelectromechanical Systems, vol. 25, No. 1, pp. 118-124, Feb. 2016. (Year: 2016).*
Kubena, R., et al., "Next Generation Quartz Oscillators and Filters for VHF-UHF Systems," 2006 IEEE International Microwave Symposium, San Francisco, CA, Jun. 11-16, 2006, pp. 668-671 (Year: 2006).*
Li, M. et al., "Ultra-Sensitive MEMS Magnetoelectric Sensor for Picotesla DC Magnetic Field Detection" MEMS 2017, Applied Physics Letter, 110 (2017) (Year: 2017).*
Liang, C-Y et. al., "Modeling ofMagnetoelastic Nanostmctures with a Fully Coupled Mechanical-Micromagnetic Model," Nanotechnology 25 (2014). (Year: 2014).*
Nan, T. et al., "Acoustically Actuated Ultra-Compact NEMS Magnetoelectric Antennas," Nature Communications, 8:296 (2017). (Year: 2017).*
Statek, CXISM Crystal Datasheet, first accessed Mar. 14, 2016 (Year: 2016).*
Ungan, T., et al., "RF Energy Harvesting Design Using High Q Resonators," IEEE MTT-S International Microwave Workshop on Wireless Sensing, Local Positioning, and RFID, IMWS 2009, pp. 1-4. IEEE, 2009 (4 pages) (Year: 2009).*
Vrba, J., Squid Sensors: Fundamentals, Fabrication and Applications, edited by H. Weinstock Kluwer Academic, Dordrecht, The Netherlands, 1996 p. 117 (Year: 1996).*
Yao, Zhi, et al., "Bulk Acoustic Wave Mediated Multiferroic Antennas: Architecture and Performance Bound," IEEE Transactions on Antennas and Propagation, vol. 63, No. 8, Aug. 2015, pp. 3335-3344 (Year: 2015).*
Zhai, J. et al., "Detection of Pico-Tesla Magnetic Fields using Magnetic-Electric Sensors at Room Temperature," Applied Physics Letters 88, (2006). (Year: 2006).*
U.S. Appl. No. 15/801,642, Kubena, filed Nov. 2, 2017.
U.S. Appl. No. 15/965,652, Kubena, filed Apr. 27, 2018.
U.S. Appl. No. 16/370,602, Kubena, filed Mar. 29, 2019.
U.S. Appl. No. 15/899,122, Kubena, filed Feb. 19, 2018.
From U.S. Appl. No. 15/801,642 (unpublished, non-publication request filed), Notice of Allowance dated Apr. 5, 2019.
From U.S. Appl. No. 15/801,642 (unpublished, non-publication request filed), Notice of Allowance dated Jan. 29, 2019.
From U.S. Appl. No. 15/801,642 (unpublished, non-publication request filed), Notice of Allowance dated Dec. 19, 2018.
From U.S. Appl. No. 15/801,642 (unpublished, non-publication request filed), Office Action dated Jun. 14, 2018.

Azad, U., et al., "Direct Antenna Modulation (DAM) for Enhanced Capacity Performance of Near-Field Communication (Nfc) Link," IEEE Transactions on Circuits and Systems—I: Regular Papers vol. 61, No. 3, pp. 902-910, Mar. 2014.
Bennett, S.P., et al., "Magnetic Field Response of Doubly Clamped Magneto-Electric Microelectromechanical A1N-FeCo Resonators," Applied Physics Letters 111, 2017, 5 pages.
Filter Inductors—1812FS Series Datasheet, Oct. 12, 2015, retrieved online at: www.coilcraft.com/pdfs/1812fs.pdf.
Gamble, J.T., "Wideband Coherent Communication at VLF with the Experimental Transmitting Antenna Modulator (ETAM)," No. RADC-TR-73-287, Rome Air Development Center, Air Force Systems Command, Griffiss Air Force Base, NY, Dec. 1973.
Hansen, R.C. et al., "Small Antenna Handbook," John Wiley & Sons, Inc., 2011, Chapter 3.
Hu, Z. et al., "Voltage Control of Magnetism in FeGaB/PIN-PMN-PT Multiferroic Heterostructure for High-Power and High-Temperature Applications," Applied Physics Letters, 106, 022901 (2015), 4 pages.
Kawashima, H., "New Cuts for Width-Extensional Mode Quartz Crystal Resonators," Electronics & Communications in Japan, Part 3, vol. 76, No. 12, pp. 28-36, Apr. 1993.
Kim, H.J. et. al., "Piezoelectric/Magnetostructure MEMS Resonant Sensor Array for in-Plane Multi-Axis Magnetic Field Detection," IEEE MEMS 2017.
Kirby, et al. "Miniaturized VHF Quartz MEMs Resonator Design Methodology," 2017 Frequency Control Symposium, Jul. 10-13, 2017, Besancon, France.
Klemmer, T.J. et al., "Ultrahigh Frequency Permeability of Sputtered Fe—Co—B Thin Films," Journal of Applied Physics, vol. 87, No. 2, Jan. 15, 2000.
Kubena, R. "UHF Quartz MEMS Oscillators for Dynamics-Based System Enhancements," 2013 IEEE International Frequency Control Symposium, Prague, Czech Republic, Jul. 22-26, 2013 (8 pages).
Kubena, R., et al., "A Fully Integrated Quartz MEMS VHF TCXO," 2017.
Kubena, R., et al., "MEMS-based UHF Monolithic Crystal Filters for Integrated RF Circuits," Journal of Microelectromechanical Systems, vol. 25, No. 1, pp. 118-124, Feb. 2016.
Kubena, R., et al., "Next Generation Quartz Oscillators and Filters for VHF-UHF Systems," 2006 IEEE International Microwave Symposium, San Francisco, CA, Jun. 11-16, 2006, pp. 668-671.
Li, M. et al., "Ultra-Sensitive MEMS Magnetoelectric Sensor for Picotesla DC Magnetic Field Detection" MEMS 2017, Applied Physics Letter, 110 (2017).
Liang, C-Y et. al., "Modeling of Magnetoelastic Nanostructures with a Fully Coupled Mechanical-Micromagnetic Model," Nanotechnology 25 (2014).
Nan, T. et al., "Acoustically Actuated Ultra-Compact NEMS Magnetoelectric Antennas," Nature Communications, 8:296 (2017).
Statek, CX1SM Crystal Datasheet, first accessed Mar. 14, 2016.
Ungan, T., et al., "RF Energy Harvesting Design Using High Q Resonators," IEEE MTT-S International Microwave Workshop on Wireless Sensing, Local Positioning, and RFID, IMWS 2009, pp. 1-4. IEEE, 2009 (4 pages).
Vrba, J., *SQUID Sensors: Fundamentals, Fabrication and Applications*, edited by H. Weinstock Kluwer Academic, Dordrecht, The Netherlands, 1996 p. 117.
Yao, Zhi, et al., "Bulk Acoustic Wave Mediated Multiferroic Antennas: Architecture and Performance Bound," IEEE Transactions on Antennas and Propagation, vol. 63, No. 8, Aug. 2015, pp. 3335-3344.
Zhai, J. et al., "Detection of Pico-Tesla Magnetic Fields using Magnetic-Electric Sensors at Room Temperature," Applied Physics Letters 88, (2006).
U.S. Appl. No. 16/775,242, Kubena, filed Jan. 28, 2020.
Griffith, W.C. et. al., "Miniature atomic magnetometer integrated with flux concentrators," Applied Physics Letters 94, 023502 (2009) (3 pages).

(56) References Cited

OTHER PUBLICATIONS

Kubena, R.L., et al. "Wide-band multiferroic quartz MEMS antennae" Journal of Physics; Conference Series, 2019, pp. 1-5.

* cited by examiner

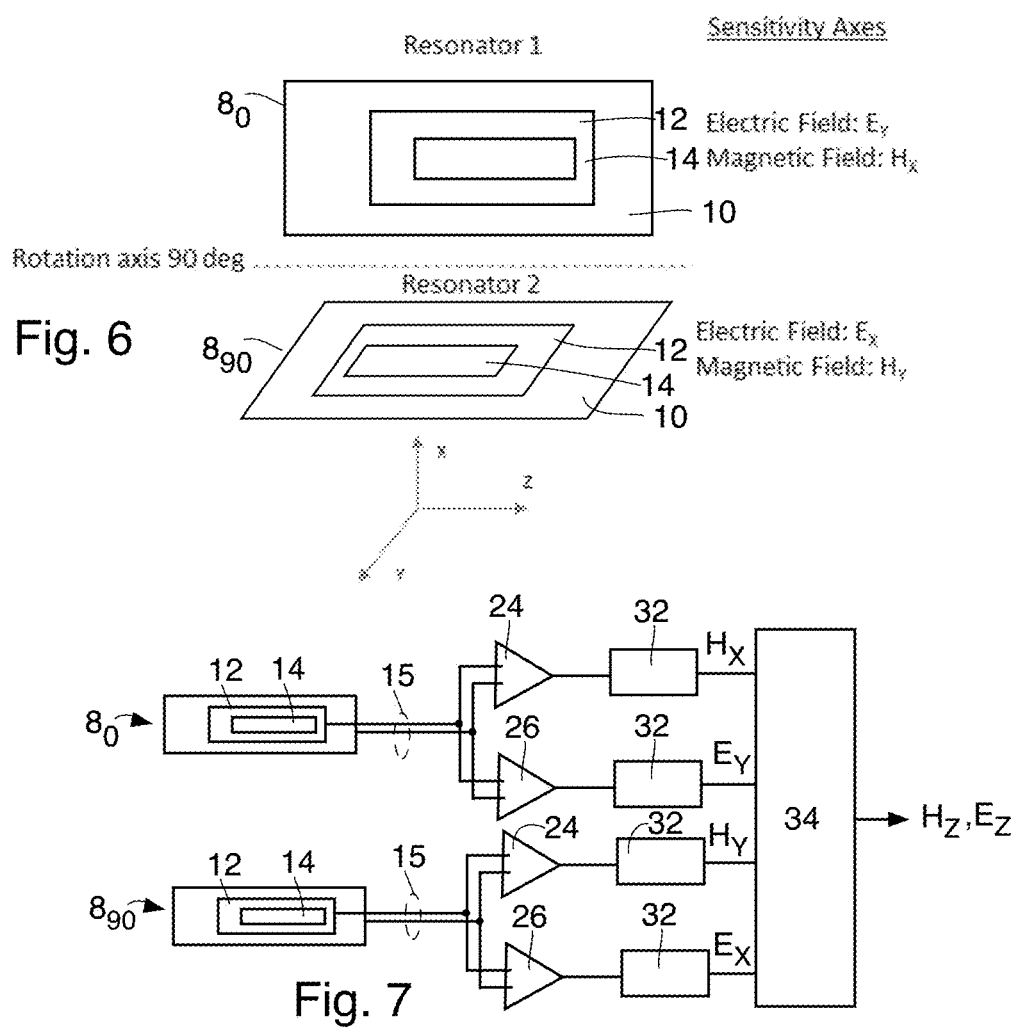

DUAL MAGNETIC AND ELECTRIC FIELD QUARTZ SENSOR

CROSS REFERENCE TO RELATED APPLICATIONS

This application claims the benefit of US Provisional Patent Application No. 62/628,612, filed 9 Feb. 2018 and entitled "A Dual Magnetic and Electric Field Quartz Sensor" the disclosure of which is hereby incorporated herein by reference.

This application is also related to U.S. Provisional Patent Application Ser. No. 62/678,897, filed 31 May 2018 and entitled "Broadband Integrated RF Magnetic Antenna" the disclosure which is hereby incorporated herein by reference.

STATEMENT REGARDING FEDERALLY SPONSORED RESEARCH OR DEVELOPMENT

None.

TECHNICAL FIELD

This invention relates to a sensor capable of sensing both magnetic and electric fields.

BACKGROUND

Traditional wire-based transmit and receive antennas have very low efficiency for wavelengths much larger than their physical size due to the large reactance they present to coupling electronics and their very low radiation resistance. Thus, there is a great need to improve the efficiency of VLF to UHF antennas for compact commercial and military systems.

Recently, a new type of antenna has been investigated in which the Radio Frequency (RF) signal is converted to an acoustic signal with a much smaller wavelength than the original signal due to a much slower acoustic velocity in materials compared to the speed of light. This allows small high efficiency antennas to be constructed since the detected energy is converted to a highly confined acoustic mode which is small compared to the original RF wavelength. The conversion of an electromagnetic wave to an acoustic signal is accomplished through a combination of a magnetostrictive material added to a piezoelectric element, thus converting the magnetic field energy to strain energy and then strain into a voltage in the piezoelectric element. At the piezoelectric element's mechanical resonance, this voltage is increased by the mechanical Q of the resonance. Thus, high Q piezoelectric elements are desirable for high sensitivity and high transmit power.

Three universities, which are believed to be actively researching in this area, are UCLA, Northeastern University, and Virginia Tech. Each have published in this area. See, for example, Zhi Yao, et al., "Bulk Acoustic Wave Mediated Multiferroic Antennas: Architecture and Performance Bound," *IEEE Transactions on Antennas and Propagation*, Vol. 63, August 2015, pp. 3335-3344; Tianxiang Nan, et al., "Acoustically Actuated Ultra-Compact NEMS Magnetoelectric Antennas," *Nature Communications*, 8:296 (DOI: 10.1038/541467-017-00343-8); Junyi Zhai, et al., "Detection of Pico-Tesla magnetic Fields using Magneto-electric Sensors at Room Temperature," *Applied Physics Letters*, vol. 88 (2006) (DOI: 10.1063/1.2172706). The UCLA experimental work has involved using YIG/ZnO SAW and SAW resonators with FeCoB magnetostrictive films. The Northeastern group have used AlN resonators with FeGaB magnetostrictive films. The Virginia Tech work involved non-resonant structures (no Q enhancement) of Terfenol-D plates bonded with adhesives to PZT piezoelectric plates. The UCLA and Northeastern piezoelectric devices had Qs≤1000 in the VHF to UHF bands, and as stated above had high temperature sensitivities. None of these previous magnetostrictive sensors have been reported to have both magnetic and electric field comparable sensitivities, and none have been configured in mounts that can determine the propagation direction and polarization of the RF wave from only a few sensors.

These new antenna elements have been discovered to respond to the electric and magnetic fields in an RF wave with a unique frequency signature. The electric field can produce the highest voltage across the plates at the antiresonance (high impedance frequency) of the resonator when connected to a high impedance load while the magnetic field can produce the highest voltage across the plates at the series resonance (low impedance of the resonator) when driving a low impedance amplifier. The difference in the frequency response can be filtered with high Q quartz filters to provide a user with the ability to determine the magnetic and electric fields strengths in particular directions. With two resonators mounted in perpendicular sense directions, the direction and polarization properties of an incident RF field can be determined.

Quartz MEMS resonators manufactured by HRL Laboratories of Malibu, Calif. (HRL) have demonstrated Qs from 200,000 to 10,000 in these frequency ranges and have temperature stability which are typical of AT-cut quartz resonators (several ppm over temperature). In addition, many HRL manufactured quartz resonators have inherent resistance of <100 ohms which allows arrays of resonators to be connected for higher signal/noise. Novel quartz resonator designs are also described which can decouple the magnetostrictive films from the piezoelectric resonator for maintaining high Q even with the application of thick (~1 micron) magnetostrictive films. See, for example:

1. R. L. Kubena, F. P. Stratton, D. T. Chang, R. J. Joyce, and T. Y. Hsu, "Next Generation Quartz Oscillators and Filters for VHF-UHF Systems," 2006 *IEEE International Microwave Symposium*, San Francisco, Ca., Jun. 11-16, 2006, the disclosure of which is hereby incorporated herein by reference.
2. R. L. Kubena, D. J. Kirby, Yook-Kong Yong, D. T. Chang, F. P. Stratton, H. D. Nguyen, R. J. Joyce, R. Perahia, H. P. Moyer, and R. G. Nagele "UHF Quartz MEMS Oscillators for Dynamics-Based System Enhancements,", 2013 *IEEE International Frequency Control Symposium*, Prague, Czech Republic, Jul. 22-26, 2013, the disclosure of which is hereby incorporated herein by reference.
3. R. L. Kubena, F. P. Stratton, H. D. Nguyen, D. J. Kirby, D. T. Chang, R. J. Joyce, Y. K. Yong, J. F. Garstecki, M. D. Cross, and S. E. Seman, "A Fully Integrated Quartz MEMS VHF TCXO," 2017 *IEEE Frequency Control Symposium*, Besancon, Fr., pp. 68-71, July 2017, the disclosure of which is hereby incorporated herein by reference.
4. R. L. Kubena, H. D. Nguyen, R. Perahia, F. P. Stratton, R. J. Joyce, D. T. Chang, D. J. Kirby, and P. D. Brewer, "MEMS-Based UHF Monolithic Crystal Filters for Integrated RF Circuits," *Journal of Microelectromechanical Systems*, Vol. 25, No. 1, February 2016, the disclosure of which is hereby incorporated herein by reference.

The present patent document describes a single sensing element (antenna) that can sense both the local magnetic and electric fields simultaneously with similar sensitivities to that of prior art antennas. The antenna can be made to be highly sensitive to only one direction of the magnetic and electric fields, and these directions can be orthogonal. This provides more information about the RF wave for each sensors and simplifies the determination of the direction and polarization of the incident RF wave.

BRIEF DESCRIPTION OF THE INVENTION

A RF antenna in which a magnetostrictive film is disposed on one or more quartz MEMS resonator(s) in which the electric field can be detected selectively along one axis and the magnetic field can be detected selectively along an orthogonal axis independently of the detection of the electric field.

A RF antenna for reception of RF signals in a RF frequency band, the RF antenna comprising a resonator which is very small in size compared to wavelengths corresponding to said RF frequency band, the resonator having a resonating element with a magnetostrictive film deposited thereon. The magnetostrictive film is preferably Ni.

A method of detecting the magnetic and electrical field strengths of RF radiation comprising sensing the RF radiation with a resonator having a magnetostrictive film deposited thereon and coupling the resonator to a transimpedance amplifier for detecting the magnetic field strength and coupling the resonator to a high impedance amplifier for detecting the electrical field strength.

BRIEF DESCRIPTION OF THE DRAWINGS

FIG. 1 is perspective view while

FIG. 6 depicts two dual electric and magnetic field sensors which are rotated by 90 degrees relative to each other for detecting Ex, Ey, Hx, and Hy in a RF field having an arbitrary propagation direction.

FIG. 7 is a schematic view showing the two dual electric and magnetic field sensors connected to amplifiers whose outputs may be applied to suitable A/D converters whose outputs in turn are provided to a digital processor.

DETAILED DESCRIPTION

Figure 1:
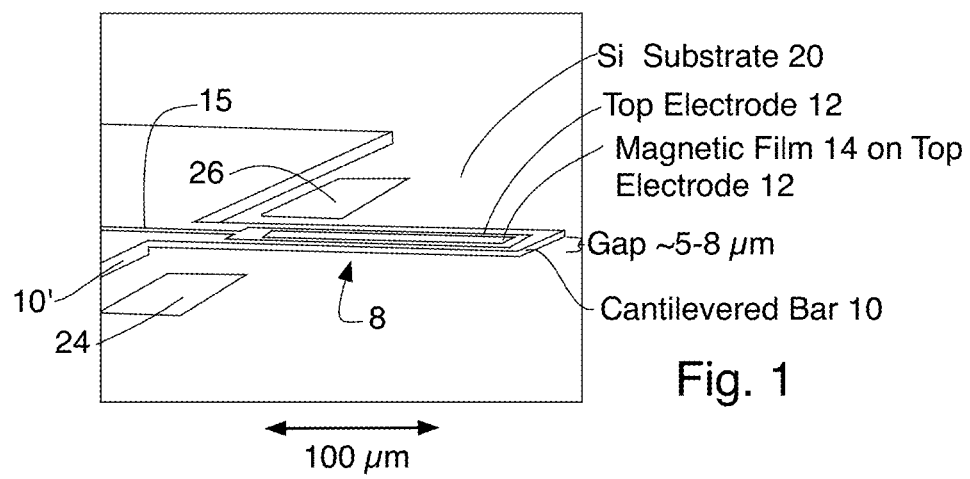

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Fabrication processes for quartz MEMS devices have been described in previous U.S. Pat. Nos. 7,750,535; 7,851, 971; and 8,765,615, and in U.S. patent application Ser. No. 14/973,701 filed Dec. 17, 2015 and in US Provisional Patent Application Ser. No. 62/417,111 filed on Nov. 3, 2016, the disclosures of which are hereby incorporated herein by reference. These patents and patent applications describe starting with a quartz resonator wafer and depositing topside electrode metal and the interconnect metal for running to the bond pads. However, in the new process a magnetostrictive film such as FeGaB or FeCoB is deposited on one of a pair of resonators, preferably with a sputtering process, either soon before or soon after metallic electrodes are formed.

Figure 1A:
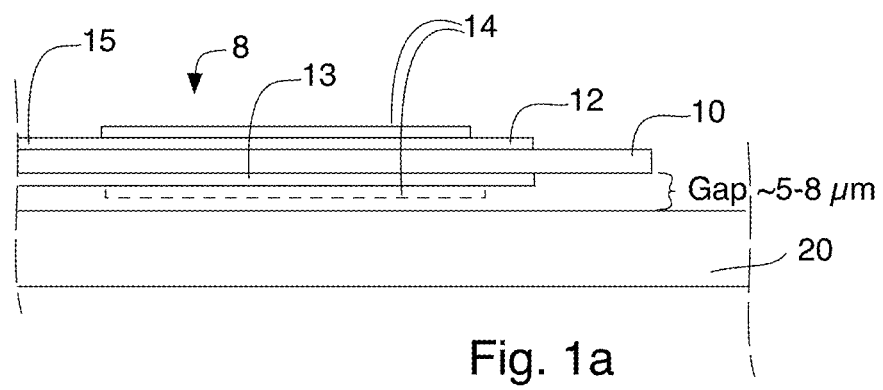
FIG. 1a is a side view of magnetically-induced piezoelectric MEMS shear-mode resonator for VHF to UHF antenna applications.

The basic quartz shear-mode resonator design with a magnetostrictive film 14 applied to at least the top electrode 12 of a cantilevered quartz substrate or body 10 is shown in a perspective view in FIG. 1 and a side elevational view in FIG. 1a. This resonator 8 can be made sensitive to a magnetic field in the cantilever's short (width) direction while it is also sensitive to an electric field in the direction perpendicular to the plane of the cantilever.

The resonator 8 preferably comprises a cantilevered substrate, bar or body 10 of quartz material which may be disposed over a semiconductor substrate 20 such as silicon or a group III-V semiconductor material system semiconductor and spaced therefrom by a gap preferably in the range of 5 to 8 µm. The cantilevered bar or body 10 may extend from (and be unitary with) a relatively thicker portion 10' of the quartz body so that the relatively thicker portion 10' may be affixed to the semiconductor substrate 20 while maintaining a gap between the relatively thinner cantilevered portion and the semiconductor substrate 20. The semiconductor substrate 20 preferably embodies the electronic circuits mentioned below including a transimpedance amplifier 24 and a high impedance amplifier 26 described below with reference to FIG. 5.

The resonator 8 preferably has two electrodes disposed thereon, a top electrode 12 and an opposing bottom electrode 13. Both electrodes 12, 13 may be formed of copper or some other electrically conductive material such as aluminum. The electrodes 12, 13 have associated conductors 15 which couple with the electronic circuits described below with reference to FIG. 5. At least one of its electrodes and preferably its top electrode 12 has a layer of a magnetostrictive material film 14 disposed thereon as shown on FIGS. 1 and 1a. In FIGS. 1 and 1a the magnetostrictive material film 14 is shown partially covering an associated electrode (for ease of illustration), but the magnetostrictive material film 14 preferably covers most, if not all, of the neighboring electrode 12. The lower electrode 13 may optionally or alternatively be provided with a layer of a magnetostrictive material film 14 as shown by dashed lines on FIG. 1a.

The electrodes 12 and 13 and the associated magnetostrictive material film 14 disposed thereon preferably have an elongated configuration such that both are longer than they are wide. The electrodes 12 and 13 together with their associated magnetostrictive material films 14 preferably have the same mass. The electrodes, if made from Al, for example, may have a thickness of 800 Å while the magnetostrictive material film 14, if made from Ni, for example, may have a thickness of 0.2 µm. If the magnetostrictive material film 14 is not utilized on the bottom electrode 13, then the bottom electrode 13 is then preferably formed to be thicker than the top electrode 12 so that the mass of the top electrode 12 plus the magnetostrictive material film 14 deposited thereon is the same as the mass of the bottom electrode 13 (without a magnetostrictive material film deposited thereon).

The magnetostrictive material film 14 may be a ferromagnetic material which exhibits magnetostrictive (or magneto-elastic) materials, such as Ni, Terfenol-D, FeGa, FeGaB, MnZn Ferrite, FeCoB and/or certain MetGlas alloys. There are other magnetostrictive materials than those identified above which may be utilized for film 14.

Figure 2:
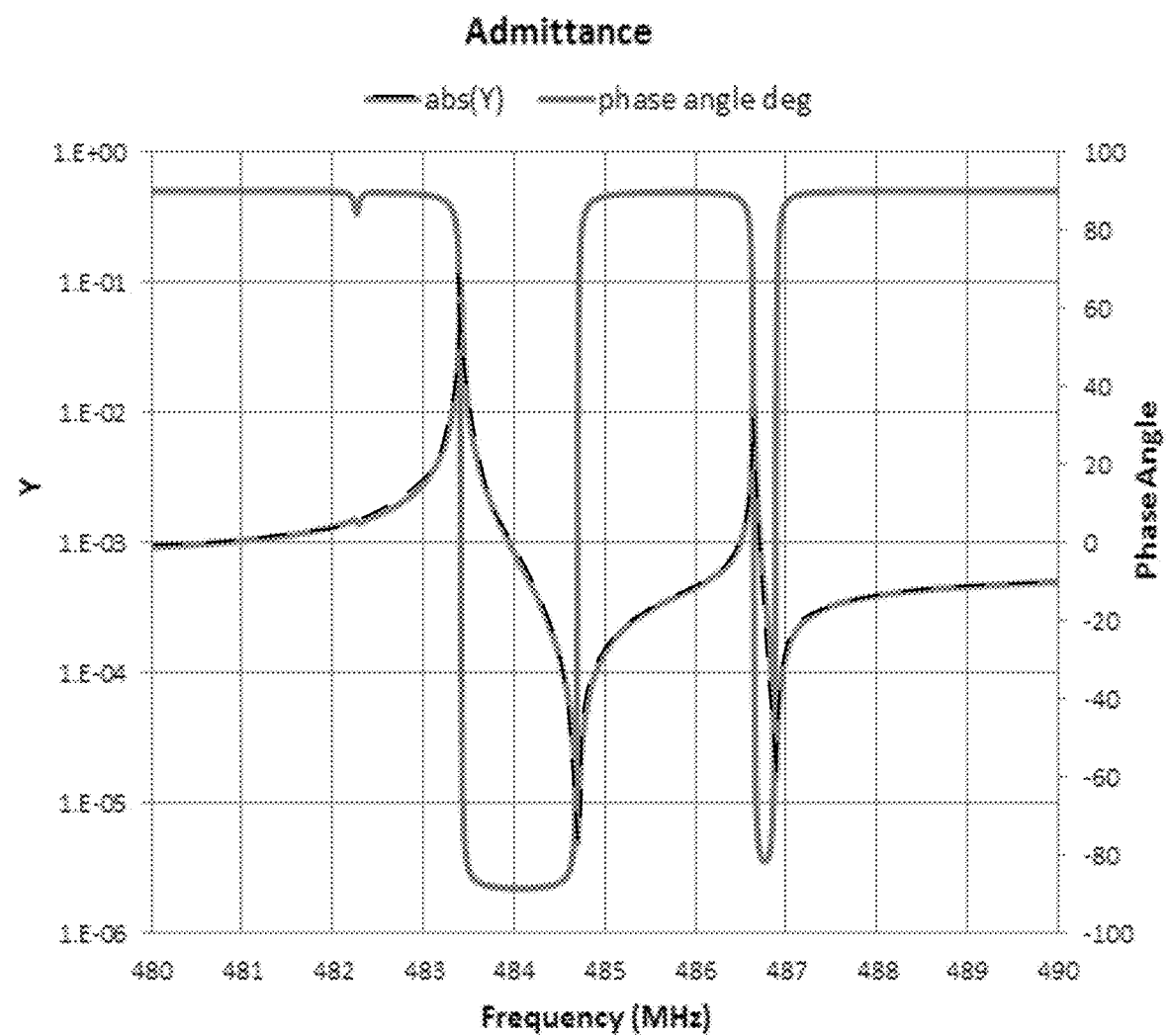
FIG. 2 is a graph of the admittance of a Ni coated resonator with no RF field applied. The series resonant frequency is near 483.3 MHz while the anti-resonance is near 484.7 MHz.
Figure 3:
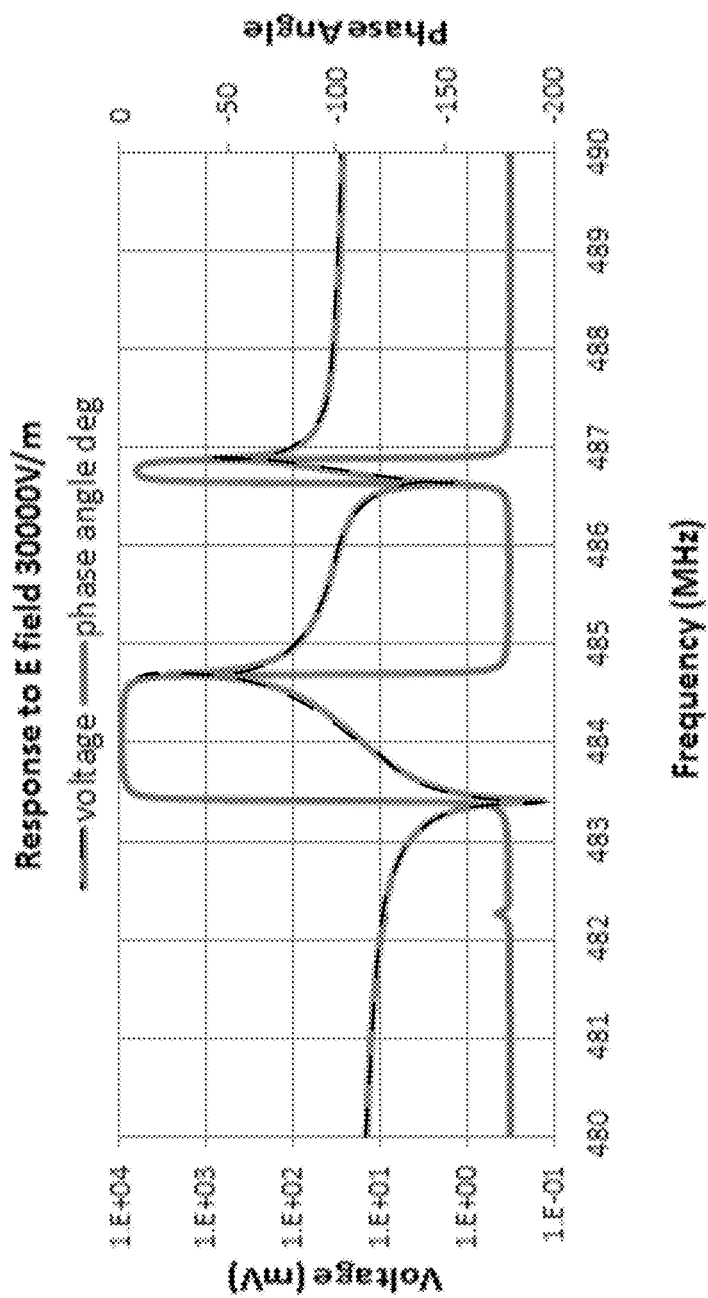
FIG. 3 is a graph of the response of the sensor from an applied electric field E. The peak response occurs at the antiresonance frequency of 484.7 MHz.
Figure 4A:
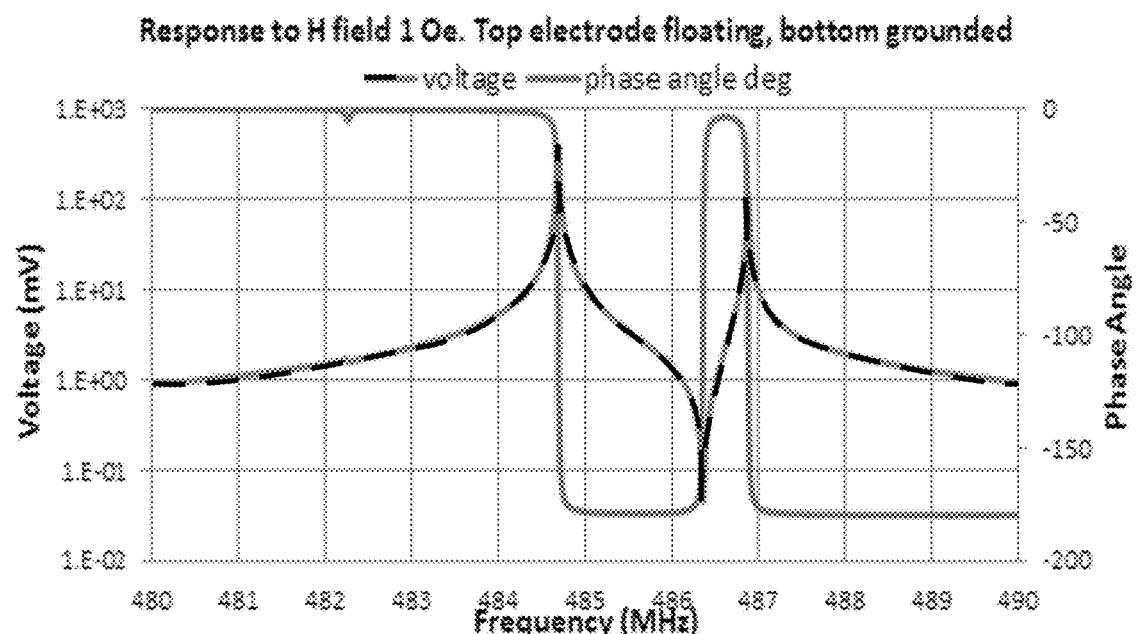
FIGS. 4a and 4b are graphs of the response of the sensor from an applied magnetic field H. If the input is applied to a high impedance load (FIG. 4a), the response is highest at the anti-resonance (see FIG. 4a at 484.7 MHz). However, if the input of the sensor is applied to a virtually grounded amplifier, the peak of the response occurs at the resonant frequency of 483.3 MHz (see FIG. 4b). The values of the electric and magnetic fields in FIGS. 3, 4a and 4b are appropriate for an incident RF wave.
Figure 4B:
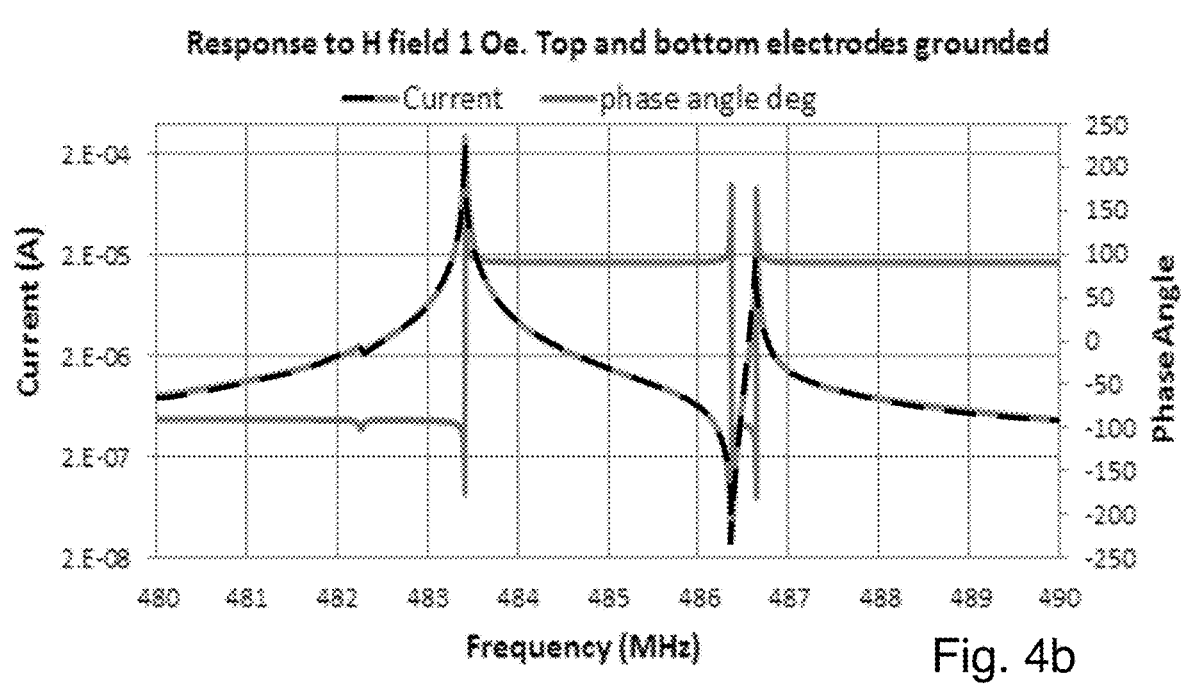
Figure 5:
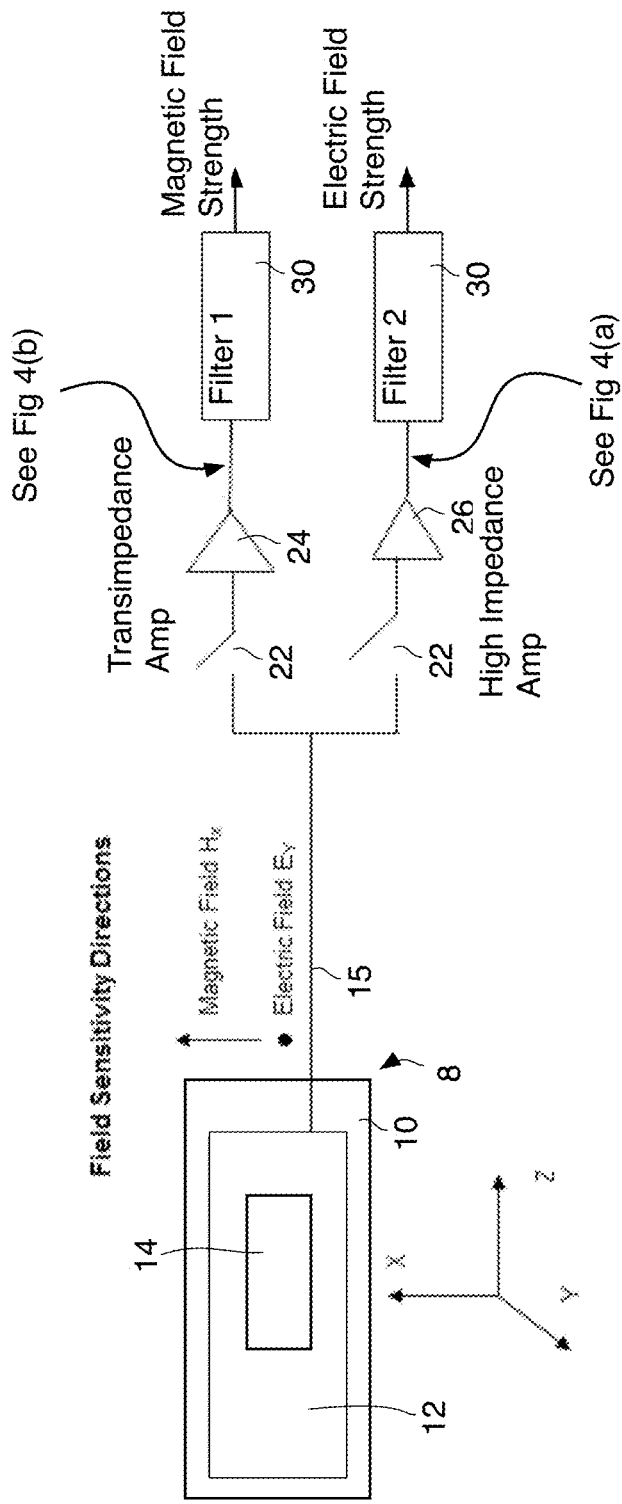
FIG. 5 depicts a dual magnetic and electric field sensor based on the different frequencies of response of the two signals.

When operated as a typical oscillator, the admittance of the resonator 8, having electrodes 12 and 13 with a size of approximately 50 µm wide by 150 µm long disposed on a quartz substrate 10 having a size of approximately 75 µm wide by 300 µm long, is shown in FIG. 2. However, when the resonator 8 is used as an electric field sensor the open circuit voltage response is shown in FIG. 3. One can see that the peak absolute voltage of the resonator 8 produced by an electric field is located at the frequency of anti-resonance in the admittance. It has been determined, however, that when the resonator 8 is used as a magnetic sensor, the voltage and current responses are shown in FIGS. 4a and 4b. One can see that the peak absolute open-circuit voltage (with the top electrode 12 floating and the bottom electrode 13 grounded . . . see FIG. 4a) of the resonator 8 produced by a magnetic field is also located at the anti-resonance in the admittance (484.7 MHz), but the short-circuit current response (the top and bottom electrodes are nearly shorted due to the low input impedance of a transimpedance amplifier . . . see FIG. 4b) is located at the series resonance (483.3 MHz). Thus, by applying the output of the resonator 8 to a transimpedance amplifier 24 (see FIG. 5) with a virtual ground or a high impedance amplifier 26 such as a non-inverting opamp, one can separate the magnetic and electric field responses by filtering the output with filters 30 and the resonator 8 thus can function as a magnetic and electric field sensor (or antenna). Since for most AT-cut quartz resonators the series and antiresonances are separated by 100's of ppm, the two responses can be easily filtered by narrow band quartz filters (see, for example, Kubena, R. L. et al. "MEMS-Based UHF Monolithic Crystal Filters for Integrated RF Circuits," *Journal of Microelectromechanical Systems*, Vol. 25, No. 1, February 2016). Once filtered, the signals can be processed to yield the magnitude of one component each of the magnetic and electric fields. This is shown in FIG. 5.

Since the input impedance of the transimpedance amplifier 24 is very low compared to the input impedance of amplifier 26, preferably only one of those two amplifiers is connected to the resonator 8 at any given instance of time, therefor switches 22 are preferably placed between the output of resonator 8 and the inputs of the transimpedance amplifier 24 and the high-z amplifier 26. The switches 22 allow the electric field to be detected by resonator 8 in combination with high impedance amplifier 26 along one axis of resonator 8 and the magnetic field to be detected by resonator 8 in combination with transimpedance amplifier 24 along an orthogonal axis of resonator 8 independently of the detection of the electric field.

By disposing two resonators $8_0$ and $8_{90}$ in different perpendicular planes, as shown in FIG. 6, the components of the electric fields Ex and Ey and magnetic fields Hx and Hy can be determined along two orthogonal directions. Since electric and magnetic fields are orthogonal to each other in a RF wave and the amplitudes of electric and magnetic fields are proportional to each other with the proportionality factor being the speed of light, this places two additional constraints on the values of the third electric field $E_Z$ and magnetic field Hz components, thereby also allowing their determination by calculation. Thus, for polarized incident RF waves, the direction of propagation and the polarization of the wave can be determined with only two orthogonally disposed resonators $8_0$ and $8_{90}$, thus greatly simplifying and reducing the size of a RF field sensor (or antenna) package.

The resonators $8_0$ and $8_{90}$ (whose major planes are rotated 90 degrees with respect to each other) may be connected amplifiers 24 and 26, the outputs of which may be applied to suitable A/D converters 32, which in turn have outputs that are provided to a digital processor 34. The outputs of A/D converters 32 are each associated with one of the resonators $8_0$ and $8_{90}$. See the schematic drawing of FIG. 7. The computation of the third components (Hz and $E_Z$) of the magnetic and electric fields can be performed by digital processor 34 which is preferably implemented by a low power RISC processor using, for example, only mWs of power.

The sizes of the electrodes 12 and 13 mentioned above may be increased, for example, to work at lower frequencies (down to VLF and possibly below) or decreased to work at even higher frequencies than those mentioned above.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . ."

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A radio frequency (RF) field sensor in which a magnetostrictive film is disposed on one or more electrodes of one or more quartz resonator(s) in which:
    an electric field of the RF field is detected along one axis of the RF field sensor and a magnetic field of the RF field is detected along an orthogonal axis of the RF field sensor independently of detection of the electric field.

2. The radio frequency (RF) field sensor of claim 1 in which the quartz resonator is an AT-cut shear-mode resonator.

3. The radio frequency (RF) field sensor of claim 1 in which the magnetostrictive film comprises a ferromagnetic material such as FeGaB or FeCoB or Ni.

4. The radio frequency (RF) field sensor of claim 1 in which the electric field is observed at a different frequency than is the magnetic field.

5. The radio frequency (RF) field sensor of claim 4 in which signals corresponding to said electric and magnetic fields are filtered to determine the amplitudes of each of the electric and magnetic fields of an RF wave impinging the RF field sensor.

6. A radio frequency (RF) apparatus in which a RF field sensor according to claim 1 is coupled with first and second amplifiers, the first amplifier being a transimpedance amplifier for detecting a short-circuit current from the RF antenna and the second amplifier being a high impedance amplifier for detecting an open-circuit voltage from the RF antenna.

7. The radio frequency (RF) antenna wherein two or more RF sensors according to claim 1 are disposed orthogonally with respect to each other and configured so that a direction and polarization of an incident RF wave can be sensed.

8. The Radio Frequency (RF) antenna of claim 7 wherein the two RF sensors are each coupled with a transimpedance amplifier and a high impedance amplifier, whose outputs are coupled to a data processing device so that the two RF sensors detect two of three components of the electric field of an incident RF wave and two of the three components of the magnetic field of said incident RF wave and wherein the processing device is configured to calculate the third of three components of the electric field of said incident RF wave and the third of the three components of the magnetic field of said incident RF wave.

9. The radio frequency (RF) antenna of claim 8 in which the third components of the electric and magnetic fields are computed based on the orthogonality of the magnetic and electric fields in a RF wave and their fixed amplitude ratio.

10. The radio frequency (RF) antenna of claim 9 wherein the data processing device is a low power processor located with the two RF sensors.

11. A radio frequency (RF) antenna for reception of RF electric field and magnetic field signals in a RF frequency band, the RF antenna comprising a resonator which is small in size compared to wavelengths corresponding to said RF frequency band, the resonator having a resonating element with a magnetostrictive film deposited thereon, the resonator sensing the electric field of the RF along one axis of the resonator and sensing the magnetic field of the RF along an orthogonal axis of the RF the resonator independently of the sensing of the electric field.

12. The RF antenna of claim 11 wherein the magnetostrictive film is FeGaB or FeCoB or Ni.

13. A method of detecting magnetic and electrical field strengths of radio frequency (RF) radiation comprising sensing the RF radiation with a resonator having a magnetostrictive film deposited thereon and coupling the resonator to a transimpedance amplifier for detecting the magnetic field strength and coupling the resonator to a high impedance amplifier for detecting the electrical field strength.

14. The method of claim 13 wherein the resonator is coupled to the transimpedance amplifier via a first switch and the resonator is coupled to the high impedance amplifier via a second switch.

15. The method of claim 14 wherein the transimpedance amplifier is coupled to a first Analog-to-Digital (A/D) converter and the high impedance amplifier is coupled to a second Analog-to-Digital (A/D) converter.

16. The method of claim 15 wherein the A/D converters are coupled with a digital processor.

17. The method of claim 13 wherein two resonators are utilized each disposed orthogonally with respect to the other resonator, each of the two orthogonally disposed resonators being coupled to both a transimpedance amplifier for detecting a magnetic field strength sensed thereby and to a high impedance amplifier for detecting the electrical field strength sensed thereby, the outputs of the transimpedance amplifiers and the high impedance amplifiers being coupled with a digital processor via Analog-to-Digital (A/D) converters, the two orthogonally disposed resonators sensing two orthogonal components of the magnetic and electrical field strengths of RF radiation and the digital processor being adapted to calculate a third orthogonal components of the magnetic and electrical field strengths of RF radiation.

18. A radio frequency (RF) system comprising:
an RF field sensor in which a magnetostrictive film is disposed on one or more electrodes of one or more quartz resonator(s), wherein an electric field of a sensed RF field is detected along one axis of the RF field sensor and a magnetic field of the sensed RF field is detected along an orthogonal axis of the RF field sensor independently of detection of the electric field;
a low impedance amplifier coupled to the RF field sensor for detecting a short-circuit current from said RF field sensor; and
a high impedance amplifier coupled to the RF field sensor for detecting an open-circuit voltage from said RF field sensor.

19. The radio frequency (RF) system of claim 18 wherein the electrodes each have a rectangular configuration and therein the magnetostrictive film also has a rectangular configuration which substantially covers at least one of said one or more electrodes.

20. A radio frequency (RF) field sensor in which a magnetostrictive film is disposed on one or more electrodes of one or more quartz resonator(s) comprising:
an electric field detector for detecting an electric field signal along one axis of the RF field sensor; and
a magnetic field detector for detecting a magnetic field along an orthogonal axis of the RF field sensor independently of detection of the electric field.

* * * * *